United States Patent
Zhang et al.

(10) Patent No.: US 10,587,266 B2
(45) Date of Patent: Mar. 10, 2020

(54) LEVEL-SHIFT CIRCUIT AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Xianming Zhang, Guangdong (CN); Yu-Hua Chang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 61 days.

(21) Appl. No.: 15/576,766

(22) PCT Filed: Nov. 2, 2017

(86) PCT No.: PCT/CN2017/109095
§ 371 (c)(1),
(2) Date: Nov. 24, 2017

(87) PCT Pub. No.: WO2019/015168
PCT Pub. Date: Jan. 24, 2019

(65) Prior Publication Data
US 2019/0028103 A1    Jan. 24, 2019

(30) Foreign Application Priority Data
Jul. 20, 2017 (CN) .......................... 2017 1 0594967

(51) Int. Cl.
*H02H 3/093*    (2006.01)
*H03K 19/003*    (2006.01)
*G09G 5/00*    (2006.01)
*H03K 19/0185*    (2006.01)

(52) U.S. Cl.
CPC ....... *H03K 19/00315* (2013.01); *G09G 5/003* (2013.01); *H02H 3/0935* (2013.01); *H03K 19/00384* (2013.01); *H03K 19/01855* (2013.01); *G09G 2300/08* (2013.01); *G09G 2310/0267* (2013.01); *G09G 2310/0289* (2013.01); *G09G 2330/025* (2013.01); *G09G 2330/026* (2013.01)

(58) Field of Classification Search
CPC ..... H02H 3/0935; H01L 27/0251; G09G 3/36
USPC ............................................. 257/358; 361/95
See application file for complete search history.

*Primary Examiner* — Abdul-Samad A Adediran
(74) *Attorney, Agent, or Firm* — Muncy, Geissler, Olds & Lowe, PC

(57) ABSTRACT

The present disclosure provides a level-shift circuit and a display device. The level-shift circuit includes a logic setting unit, a control unit, a first field effect transistor, a second field effect transistor, and an over-current protection module. An input terminal of the logic setting unit is input with an initial signal. An output terminal of the logic setting unit is connected with an input terminal of the control unit. The over-current protection module is configured to reduce a resistance of the level-shift circuit when the level-shift circuit is in an initial stage, and increase the resistance of the level-shift circuit when the level-shift circuit is in a working stage.

20 Claims, 2 Drawing Sheets

LEVEL-SHIFT CIRCUIT AND DISPLAY DEVICE

BACKGROUND OF THE DISCLOSURE

Field of Disclosure

The present disclosure relates to the field of display technology, and particularly to a level-shift circuit and a display device.

Description of Prior Art

Level-shift circuits (level shifters) are important ICs used in gate driver on array (GOA) circuits. One main function is to convert an input logic signal CK-IN to a high-level logic signal CLK-OUT. As shown in FIG. 1, a conventional level-shift circuit comprises a logic setting unit 11, a control unit 12, a first field effect transistor Q1, and a second field effect transistor Q2. Both the logic setting unit 11 and the control unit 12 are used for converting a low-level voltage signal into a high-level voltage signal. A gate electrode of the first field effect transistor Q1 is connected with a first output terminal 121 of the control unit 12, a source electrode of the first field effect transistor Q1 is connected with a high-level voltage VGH. A gate electrode of the second field effect transistor Q2 is connected with a second output terminal 122 of the control unit 12, a source electrode of the second field effect transistor Q2 is connected with a low-level voltage VGL, drain electrodes of the first field effect transistor Q1 and the second field effect transistor Q2 are connected with a total output terminal, to output CLK-OUT.

During use of level shifter, there is short circuit problem. At this time, resistors are added to the CK wiring in series, to prevent incremental on current, and also to prevent over current from false triggering and melting when the display device is starting. However, the series resistance will affect voltage climbing time of the level shifter, thereby reducing display performance.

Therefore, it is necessary to provide a level-shift circuit and a display device to solve the problems existing in the conventional art.

SUMMARY OF THE DISCLOSURE

The objective of the present disclosure is to provide a level-shift circuit and a display device, which are capable of shortening the rising time of the peak current and avoiding the boot current from being too large.

In order to solve the above technical problem, the present disclosure provides a level-shift circuit, which comprises a logic setting unit, a control unit, a first field effect transistor, a second field effect transistor, and an over-current protection module.

An input terminal of the logic setting unit is input with an initial signal. An output terminal of the logic setting unit is connected with an input terminal of the control unit. The control unit comprises a first output terminal, a second output terminal, a third output terminal, and a fourth output terminal. A gate electrode of the first field effect transistor is connected with the first output terminal and a source electrode of the first field effect transistor is input with a high-level voltage. A gate electrode of the second field effect transistor is connected with the second output terminal and a source electrode of the second field effect transistor is input with a low-level voltage. Drain electrodes of the first field effect transistor and the second field effect transistor are connected with a total output terminal.

The over-current protection module is connected with the control unit and configured to reduce a resistance of the level-shift circuit when the level-shift circuit is in an initial stage, and increase the resistance of the level-shift circuit when the level-shift circuit is in a working stage.

The over-current protection module comprises a third field effect transistor, a fourth field effect transistor, a first retard unit, and a second retard unit.

An input terminal of the first retard unit is connected with the third output terminal. An input terminal of the second retard unit is connected with the fourth output terminal.

A gate electrode of the third field effect transistor is connected with an output terminal of the first retard unit and a source electrode of the third field effect transistor is input with a high-level voltage. A gate electrode of the fourth field effect transistor is connected with an output terminal of the second retard unit. A source electrode of the fourth field effect transistor is input with a low-level voltage. Drain electrodes of the third field effect transistor and the fourth field effect transistor are connected with the total output terminal.

The first retard unit is configured to generate a first control signal based on a switching signal provided by the control unit. The second retard unit is configured to generate a second control signal based on the switching signal provided by the control unit.

The first field effect transistor is a P-channel field effect transistor; and the second field effect transistor is an N-channel field effect transistor.

In the level-shift circuit of the present disclosure, the third field effect transistor is a P-channel field effect transistor, and the fourth field effect transistor is an N-channel field effect transistor.

In the level-shift circuit of the present disclosure, a resistance of the third field effect transistor is less than a resistance of the fourth field effect transistor, and the first control signal is at a high level and the second control signal is at a low level when the level-shift circuit is in the initial stage.

The first control signal is at a low level and the second control signal is at the low level when the level-shift circuit is in the working stage.

In the level-shift circuit of the present disclosure, the switching signal comprises a first switching signal and a second switching signal. The first retard unit comprises a first switch, a second switch, a first capacitor, a first voltage comparator, a first inverter, and a first AND gate.

An input terminal of the first switch is connected with a DC power source. An output terminal of the first switch is electrically connected with one terminal of the first capacitor. A control terminal of the first switch is input with the first switching signal and another terminal of the first capacitor is grounded. An input terminal of the second switch is electrically connected with the terminal of the first capacitor. An output terminal of the second switch is electrically connected with the other terminal of the first capacitor. A control terminal of the second switch is input with the second switching signal.

A positive input terminal of the first voltage comparator is electrically connected with the output terminal of the first switch. A negative input terminal of the first voltage comparator is connected with a reference voltage. An output terminal of the first voltage comparator is connected to a second input terminal of the first AND gate through the first inverter. A first input terminal of the first AND gate is input with the first switching signal. An output terminal of the first AND gate outputs the first control signal.

In the level-shift circuit of the present disclosure, the first switch is turned on when the first switching signal is at a high level. The first switch is turned off when the first switching signal is at a low level.

The second switch is turned on when the second switching signal is at a high level. The second switch is turned off when the second switching signal is at a low level.

In the level-shift circuit of the present disclosure, the second retard unit comprises a third switch, a fourth switch, a second capacitor, a second voltage comparator, a second inverter, and a second AND gate.

An input terminal of the third switch is connected with a DC power source. An output terminal of the third switch is electrically connected with one terminal of the second capacitor. A control terminal of the third switch is input with the second switching signal and the other terminal of the second capacitor is grounded. An input terminal of the fourth switch is electrically connected with the terminal of the second capacitor. An output terminal of the fourth switch is electrically connected with the other terminal of the second capacitor. A control terminal of the fourth switch is input with the first switching signal.

A positive input terminal of the second voltage comparator is electrically connected with the output terminal of the third switch. A negative input terminal of the second voltage comparator is connected with a reference voltage. An output terminal of the second voltage comparator is connected to a second input terminal of the second AND gate through the second inverter. A first input terminal of the second AND gate is input with the second switching signal. An output terminal of the second AND gate outputs the second control signal.

In the level-shift circuit of the present disclosure, the third switch is turned on when the second switching signal is at a high level; the third switch is turned off when the second switching signal is at a low level.

The fourth switch is turned on when the first switching signal is at a high level. The fourth switch is turned off when the first switching signal is at a low level.

The present disclosure provides a level-shift circuit, which comprises a logic setting unit, a control unit, a first field effect transistor, a second field effect transistor, and an over-current protection module.

An input terminal of the logic setting unit is input with an initial signal. An output terminal of the logic setting unit is connected with an input terminal of the control unit. The control unit comprises a first output terminal and a second output terminal.

A gate electrode of the first field effect transistor is connected with the first output terminal and a source electrode of the first field effect transistor is input with a high-level voltage. A gate electrode of the second field effect transistor is connected with the second output terminal and a source electrode of the second field effect transistor is input with a low-level voltage. Drain electrodes of the first field effect transistor and the second field effect transistor are connected with a total output terminal.

The over-current protection module is connected with the control unit and configured to reduce a resistance of the level-shift circuit when the level-shift circuit is in an initial stage, and increase the resistance of the level-shift circuit when the level-shift circuit is in a working stage.

In the level-shift circuit of the present disclosure, the control unit further comprises a third output terminal and a fourth output terminal.

The over-current protection module comprises a third field effect transistor, a fourth field effect transistor, a first retard unit, and a second retard unit.

An input terminal of the first retard unit is connected with the third output terminal. An input terminal of the second retard unit is connected with the fourth output terminal.

A gate electrode of the third field effect transistor is connected with an output terminal of the first retard unit and a source electrode of the third field effect transistor is input with a high-level voltage. A gate electrode of the fourth field effect transistor is connected with an output terminal of the second retard unit. A source electrode of the fourth field effect transistor is input with a low-level voltage. Drain electrodes of the third field effect transistor and the fourth field effect transistor are connected with the total output terminal.

The first retard unit is configured to generate a first control signal based on a switching signal provided by the control unit. The second retard unit is configured to generate a second control signal based on the switching signal provided by the control unit.

In the level-shift circuit of the present disclosure, the third field effect transistor is a P-channel field effect transistor and the fourth field effect transistor is an N-channel field effect transistor.

In the level-shift circuit of the present disclosure, a resistance of the third field effect transistor is less than a resistance of the fourth field effect transistor, and the first control signal is at a high level and the second control signal is at a low level when the level-shift circuit is in the initial stage.

The first control signal is at a low level and the second control signal is at the low level when the level-shift circuit is in the working stage.

In the level-shift circuit of the present disclosure, the switching signal comprises a first switching signal and a second switching signal. The first retard unit comprises a first switch, a second switch, a first capacitor, a first voltage comparator, a first inverter, and a first AND gate.

An input terminal of the first switch is connected with a DC power source. An output terminal of the first switch is electrically connected with one terminal of the first capacitor. A control terminal of the first switch is input with the first switching signal and another terminal of the first capacitor is grounded. An input terminal of the second switch is electrically connected with the terminal of the first capacitor. An output terminal of the second switch is electrically connected with the other terminal of the first capacitor. A control terminal of the second switch is input with the second switching signal.

A positive input terminal of the first voltage comparator is electrically connected with the output terminal of the first switch. A negative input terminal of the first voltage comparator is connected with a reference voltage. An output terminal of the first voltage comparator is connected to a second input terminal of the first AND gate through the first inverter. A first input terminal of the first AND gate is input with the first switching signal. An output terminal of the first AND gate outputs the first control signal.

In the level-shift circuit of the present disclosure, the first switch is turned on when the first switching signal is at a high level. The first switch is turned off when the first switching signal is at a low level.

The second switch is turned on when the second switching signal is at a high level. The second switch is turned off when the second switching signal is at the low level.

In the level-shift circuit of the present disclosure, the second retard unit comprises a third switch, a fourth switch, a second capacitor, a second voltage comparator, a second inverter, and a second AND gate.

An input terminal of the third switch is connected with a DC power source. An output terminal of the third switch is electrically connected with one terminal of the second capacitor. A control terminal of the third switch is input with the second switching signal and the other terminal of the second capacitor is grounded. An input terminal of the fourth switch is electrically connected with the terminal of the second capacitor. An output terminal of the fourth switch is electrically connected with the other terminal of the second capacitor. A control terminal of the fourth switch is input with the first switching signal.

A positive input terminal of the second voltage comparator is electrically connected with the output terminal of the third switch. A negative input terminal of the second voltage comparator is connected with a reference voltage. An output terminal of the second voltage comparator is connected to a second input terminal of the second AND gate through the second inverter. A first input terminal of the second AND gate is input with the second switching signal. An output terminal of the second AND gate outputs the second control signal.

In the level-shift circuit of the present disclosure, the third switch is turned on when the second switching signal is at a high level; the third switch is turned off when the second switching signal is at a low level.

The fourth switch is turned on when the first switching signal is at a high level. The fourth switch is turned off when the first switching signal is at a low level.

In the level-shift circuit of the present disclosure, the first field effect transistor is a P-channel field effect transistor; and the second field effect transistor is an N-channel field effect transistor.

The present disclosure also provides a display device, which comprises the above level-shift circuit.

With adding an over-current protection module onto the conventional level-shift circuit, the level-shift circuit and the display device of the present disclosure decreases the resistance of the level-shift circuit to increase the peak of the current and shorten the rising time of the voltage at the initial stage; and increases the resistance of the level-shift circuit to limit the current and prevent from false triggering and melting.

DETAILED DESCRIPTION OF THE PREFERRED EMBODIMENTS

Figure 1:
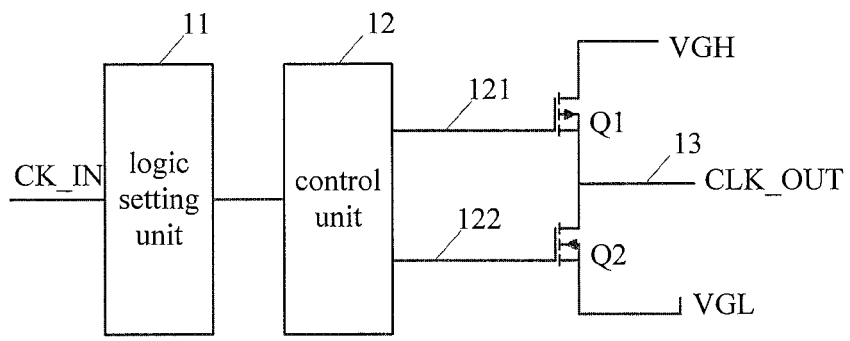
FIG. 1 is a circuit diagram of a conventional level-shift circuit.

The following description of the embodiments is directed to the attached drawings for illustrating specific embodiments in which the disclosure may be practiced. The terms of the present disclosure, such as "up", "down", "front", "post", "left", "right", "inside", "outside", "side", are merely directions referring to the attached drawings. Thus, the directional language used is for the purpose of illustrating and understanding the disclosure and is not intended to be limiting of the disclosure. In the figure, units with similar structures are denoted by the same reference numerals.

Figure 2:
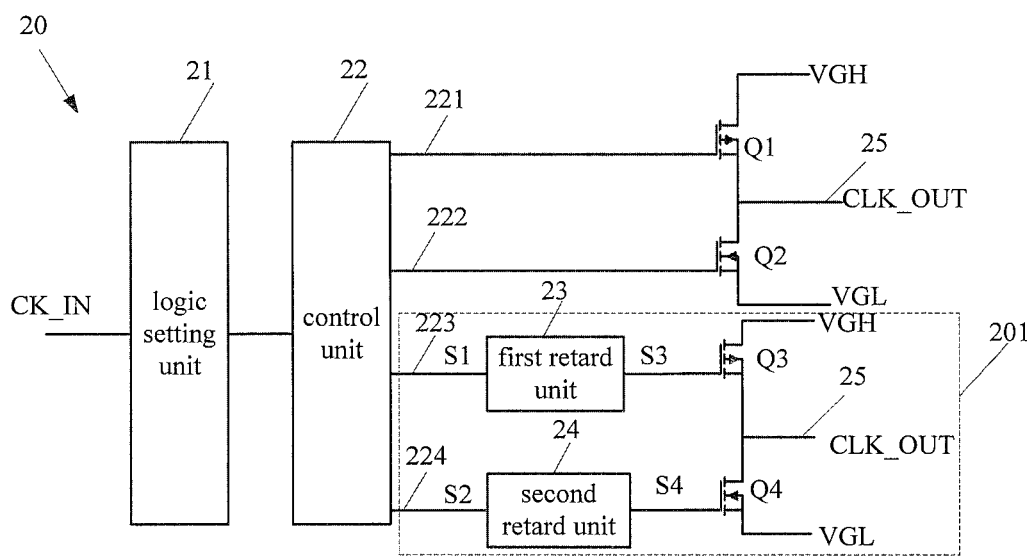
FIG. 2 is a circuit diagram of a level-shift circuit according to the present disclosure.

Please refer to FIG. 2, which is a circuit diagram of a level-shift circuit according to the present disclosure. As shown in FIG. 2, the level-shift circuit of the present disclosure comprises a logic setting unit 21, a control unit 22, a first field effect transistor Q1, a second field effect transistor Q2, and an over-current protection module 201.

The over-current protection module 201 is connected with the control unit 22 and configured to reduce resistance of the level-shift circuit when the level-shift circuit is in an initial stage, and increase the resistance of the level-shift circuit when the level-shift circuit is in a working stage.

The over-current protection module 201 comprises a third field effect transistor Q3, a fourth field effect transistor Q4, a first retard unit 23, and a second retard unit 24.

The specific connecting method is addressed as follows: An input terminal of the logic setting unit 21 is input with an initial signal CK-IN. An output terminal of the logic setting unit 21 is connected with an input terminal of the control unit 22. The control unit 22 comprises a first output terminal 221, a second output terminal 222, a third output terminal 223, and a fourth output terminal 224. The third output terminal 223 is used to output a first switching signal S1. The fourth output terminal 224 is used to output a second switching signal S2. A switching signal, provided by the control unit 22, comprises the first switching signal and the second switching signal.

A gate electrode of the first field effect transistor Q1 is connected with the first output terminal 221 and a source electrode of the first field effect transistor is input with a high-level voltage VGH. A gate electrode of the second field effect transistor Q2 is connected with the second output terminal 222 and a source electrode of the second field effect transistor Q2 is input with a low-level voltage VGL. An input terminal of the first retard unit 23 is connected with the third output terminal 223. An input terminal of the second retard unit 24 is connected with the fourth output terminal 224.

A gate electrode of the third field effect transistor Q3 is connected with an output terminal of the first retard unit 23 and a source electrode of the third field effect transistor Q3 is input with a high-level voltage VGH. A gate electrode of the fourth field effect transistor Q4 is connected with an output terminal of the second retard unit 24. A source electrode of the fourth field effect transistor Q4 is input with a low-level voltage VGL.

Drain electrodes of the first field effect transistor Q1, the second field effect transistor Q2, the third field effect transistor Q3, and the fourth field effect transistor Q4 are connected with a total output terminal 25. The total output terminal is used to output a logic signal with high potential CLK-OUT.

The first retard unit 23 is configured to generate a first control signal S3 based on a switching signal S1 provided by the control unit 22. The second retard unit 24 is configured to generate a second control signal S4 based on the switching signal S2 provided by the control unit 22. The first control signal S3 is used to control ON/OFF of the third field effect transistor Q3. The second control signal S4 is used to control ON/OFF of the fourth field effect transistor Q4.

In one embodiment, a resistance of the third field effect transistor Q3 is less than a resistance of the fourth field effect transistor Q4.

The first control signal S3 is at a high level and the second control signal S4 is at a low level when the level-shift circuit is in the initial stage.

The first control signal S3 is at a low level and the second control signal S4 is at the low level when the level-shift circuit is in the working stage.

In other words, in the initial phase (rising edge) of the level-shift circuit, the third field effect transistor Q3 and the fourth field effect transistor Q4 are turned on to increase the peak value of the current and shorten the rising time of the voltage to ensure the normal of the voltage; after a delay of a preset duration (4 us), the third field effect transistor Q3 with the smaller resistance is turned off and the fourth field effect transistor Q4 with the larger resistance is turned on, thereby increasing the resistance of the level-shift circuit, to limit the current.

Figure 3:
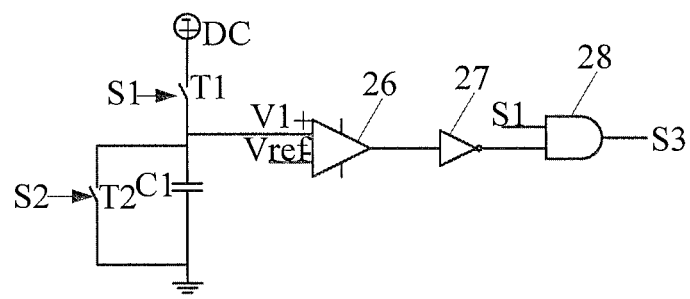
FIG. 3 is a circuit diagram of a first retard unit of a level-shift circuit according to the present disclosure.

As shown in FIG. 3, the first retard unit 23 comprises a first switch T1, a second switch T2, a first capacitor C1, a first voltage comparator 26, a first inverter 27, and a first AND gate 28.

An input terminal of the first switch T1 is connected with a DC power source DC. An output terminal of the first switch T1 is electrically connected with one terminal of the first capacitor C1. A control terminal of the first switch T1 is input with the first switching signal S1 and another terminal of the first capacitor C1 is grounded. An input terminal of the second switch T2 is electrically connected with the terminal of the first capacitor C1. An output terminal of the second switch T2 is electrically connected with the other terminal of the first capacitor C1. A control terminal of the second switch T2 is input with the second switching signal S2.

A positive input terminal of the first voltage comparator 26 is electrically connected with the output terminal of the first switch T1. A negative input terminal of the first voltage comparator 26 is connected with a reference voltage Vref. An output terminal of the first voltage comparator 26 is connected to a second input terminal of the first AND gate 28 through the first inverter 27. A first input terminal of the first AND gate 28 is input with the first switching signal S1. An output terminal of the first AND gate 28 outputs the first control signal S3.

In one embodiment, the first switch T1 is turned on when the first switching signal S1 is at a high level. The first switch T1 is turned off when the first switching signal S1 is at a low level.

The second switch T2 is turned on when the second switching signal S2 is at a high level. The second switch T2 is turned off when the second switching signal S2 is at the low level.

Specifically, when the first control signal S1 is at a high level, the third field effect transistor Q3 is turned on, and the third field effect transistor Q3 is turned on, and after a delay of a preset time, for example, 4 us delay, the third field effect transistor Q3 with a smaller resistance is turned off, to ensure resistance of the entire CK wiring.

As shown in FIG. 3, when the first switching signal S1 is at a high level, the first switch T1 is turned off, the DC power supply DC starts charging the capacitor C1, and the voltage V1 is less than Vref, so that the first voltage comparator 26 outputs a low level. Then, a high level is outputted after inversion of the first inverter 27. Then, the first control signal S3 with a high level is outputted through the first AND gate 28 (i.e., an AND operation with the first switching signal S1). Since the first control signal S3 is at a high level, the third field effect transistor Q3 is turned on.

After 4 us, V1 is greater than Vref. At this time, the first voltage comparator 26 outputs a high level. Then, a low level is outputted after the reversion of the first inverter 27. Then, the first control signal S3 with a low level is outputted through the first AND gate 28. Since the first control signal S3 is at a low level, the third field effect transistor Q3 is turned off. At the same time, if the second switching signal S2 is at a high level, the first switch T1 is turned on and the DC power supply DC is no longer charged, the second switch T2 is closed, and the capacitor C1 is discharged to ensure the continuous cyclic working of the entire system.

This method ensures that the level shifter is working normally on the rising or falling edges, shortens rising time of the voltage, and increases peak current. It also makes the level shifter have a large resistance after the normal working phase, which inhibits the error triggering OCP caused by a higher current, also inhibits risk of melting the screen to limit scope of the entire current.

In one embodiment, the first field effect transistor Q1 and the third field effect transistor Q3 are P-channel field effect transistors. The second field effect transistor Q2 and the fourth field effect transistor Q4 are N-channel field effect transistors.

The second retard unit 24 comprises a third switch T3, a fourth switch T4, a second capacitor C2, a second voltage comparator 29, a second inverter 30, and a second AND gate 31.

An input terminal of the third switch T3 is connected with a DC power source DC. An output terminal of the third switch T3 is electrically connected with one terminal of the second capacitor C2. A control terminal of the third switch T3 is input with the second switching signal S2 and the other terminal of the second capacitor C2 is grounded. An input terminal of the fourth switch T4 is electrically connected with the terminal of the second capacitor C2. An output terminal of the fourth switch T4 is electrically connected with the other terminal of the second capacitor C2. A control terminal of the fourth switch T4 is input with the first switching signal S1.

A positive input terminal of the second voltage comparator 29 is electrically connected with the output terminal of the third switch T3. A negative input terminal of the second voltage comparator 29 is connected with a reference voltage. An output terminal of the second voltage comparator 29 is connected to a second input terminal of the second AND gate 31 through the second inverter 30. A first input terminal of the second AND gate 31 is input with the second switching signal S2. An output terminal of the second AND gate 31 outputs the second control signal S4.

The third switch T3 is turned on when the second switching signal S2 is at a high level; the third switch T3 is turned off when the second switching signal S2 is at a low level.

The fourth switch T4 is turned on when the first switching signal S1 is at a high level. The fourth switch T4 is turned off when the first switching signal S1 is at a low level.

Figure 4:
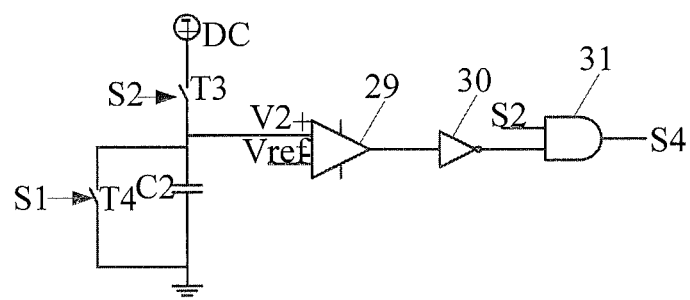
FIG. 4 is a circuit diagram of a second retard unit of a level-shift circuit according to the present disclosure.

As shown in FIG. 4, when the second switching signal S2 is at a high level, the third switch T3 is turned off, the DC power supply DC starts charging the capacitor C2, and the voltage V2 is less than Vref, so that the second voltage comparator 26 outputs a low level. Then, a high level is outputted after inversion of the second inverter 30. Then, the second control signal S4 with a high level is outputted through the second AND gate 31 (i.e., an AND operation with the first switching signal S1). Since the second control signal S4 is at a high level, the fourth field effect transistor Q4 is turned off.

After a while, V2 is greater than Vref. At this time, the second voltage comparator 29 outputs a high level. Then, a low level is outputted after the reversion of the second inverter 30. Then, the second control signal S4 with a low level is outputted through the second AND gate 31. Since the second control signal S4 is at a low level, the fourth field effect transistor Q4 is turned off. At the same time, if the first switching signal S1 is at a high level, the third switch T3 is turned on and the DC power supply DC is no longer charged, the fourth switch T4 is closed, and the capacitor C2 is discharged to ensure the continuous cyclic working of the entire system.

It is understandable that the resistance of the third field effect transistor Q3 is larger than the resistance of the fourth field effect transistor Q4 in another embodiment.

In the initial phase (rising edge) of the level-shift circuit, the third field effect transistor Q3 and the fourth field effect transistor Q4 are turned on to increase the peak value of the current and shorten the rising time of the voltage to ensure normal of the voltage; after a delay of a preset duration (4 us), the third field effect transistor Q3 with the smaller resistance is turned off and the fourth field effect transistor Q4 with the larger resistance is turned on, thereby increasing the resistance of the level-shift circuit, to limit the current.

The present disclosure further provides a display device, which comprises a GOA circuit, which comprises a level-shift circuit. The specific structure of the level-shift circuit can be referred to the above description, no more description is given here.

With adding an over-current protection module onto the conventional level-shift circuit, the level-shift circuit and the display device of the present disclosure decreases the resistance of the level-shift circuit to increase the peak of the current and shorten the rising time of the voltage at the initial stage; and increases the resistance of the level-shift circuit to limit the current and prevent from false triggering and melting.

Although the present disclosure is disclosed as preferred embodiments, the foregoing preferred embodiments are not intended to limit the present disclosure. Those of ordinary skill in the art, without departing from the spirit and scope of the present disclosure, can make various kinds of modifications and variations to the present disclosure. Therefore, the scope of the claims of the present disclosure must be defined.

What is claimed is:

1. A level-shift circuit, comprising:
a logic setting unit, a control unit, a first field effect transistor, a second field effect transistor, and an over-current protection module;
an input terminal of the logic setting unit input with an initial signal, an output terminal of the logic setting unit connected with an input terminal of the control unit;
the control unit comprising a first output terminal, a second output terminal, a third output terminal, and a fourth output terminal;
a gate electrode of the first field effect transistor connected with the first output terminal and a source electrode of the first field effect transistor input with a high-level voltage; a gate electrode of the second field effect transistor connected with the second output terminal and a source electrode of the second field effect transistor input with a low-level voltage; drain electrodes of the first field effect transistor and the second field effect transistor connected with a total output terminal;
the over-current protection module, connected with the control unit, configured to reduce a resistance of the level-shift circuit when the level-shift circuit is in an initial stage, and increase the resistance of the level-shift circuit when the level-shift circuit is in a working stage, wherein the level-shift circuit is in the initial stage when the level-shift circuit is turned on and the level-shift circuit is in the working stage after the level-shift circuit has been turned on;
wherein the over-current protection module comprises a third field effect transistor, a fourth field effect transistor, a first retard unit, and a second retard unit;
an input terminal of the first retard unit is connected with the third output terminal, an input terminal of the second retard unit is connected with the fourth output terminal;
a gate electrode of the third field effect transistor is connected with an output terminal of the first retard unit and a source electrode of the third field effect transistor is input with the high-level voltage; a gate electrode of the fourth field effect transistor is connected with an output terminal of the second retard unit and a source electrode of the fourth field effect transistor is input with the low-level voltage; drain electrodes of the third field effect transistor and the fourth field effect transistor are connected with the total output terminal;
the first retard unit is configured to generate a first control signal based on a switching signal provided by the control unit; the second retard unit is configured to generate a second control signal based on the switching signal provided by the control unit;
the first field effect transistor is a P-channel field effect transistor; and the second field effect transistor is an N-channel field effect transistor.

2. The level-shift circuit according to claim 1, wherein the third field effect transistor is a P-channel field effect transistor and the fourth field effect transistor is an N-channel field effect transistor.

3. The level-shift circuit according to claim 2, wherein a resistance of the third field effect transistor is less than a resistance of the fourth field effect transistor, and the first control signal is at a high level and the second control signal is at a low level when the level-shift circuit is in the initial stage; the first control signal is at a low level and the second control signal is at the low level when the level-shift circuit is in the working stage.

4. The level-shift circuit according to claim 1, wherein the switching signal comprises a first switching signal and a second switching signal, the first retard unit comprises a first switch, a second switch, a first capacitor, a first voltage comparator, a first inverter, and a first AND gate; an input terminal of the first switch is connected with a DC power source, an output terminal of the first switch is electrically connected with one terminal of the first capacitor, a control terminal of the first switch is input with the first switching signal, another terminal of the first capacitor is grounded, an input terminal of the second switch is electrically connected with the terminal of the first capacitor, an output terminal of the second switch is electrically connected with the other terminal of the first capacitor, a control terminal of the second switch is input with the second switching signal; a positive input terminal of the first voltage comparator is electrically connected with the output terminal of the first switch, a negative input terminal of the first voltage comparator is connected with a reference voltage, an output terminal of the first voltage comparator is connected to a second input terminal of the first AND gate through the first inverter, a first input terminal of the first AND gate is input with the first switching signal, an output terminal of the first AND gate outputs the first control signal.

5. The level-shift circuit according to claim 4, wherein the first switch is turned on when the first switching signal is at a high level; the first switch is turned off when the first switching signal is at a low level; the second switch is turned on when the second switching signal is at a high level; the second switch is turned off when the second switching signal is at the low level.

6. The level-shift circuit according to claim 1, wherein the second retard unit comprises a third switch, a fourth switch, a second capacitor, a second voltage comparator, a second inverter, and a second AND gate; an input terminal of the third switch is connected with a DC power source, an output terminal of the third switch is electrically connected with one terminal of the second capacitor, a control terminal of the third switch is input with the second switching signal, the other terminal of the second capacitor is grounded, an input terminal of the fourth switch is electrically connected with the terminal of the second capacitor, an output terminal of the fourth switch is electrically connected with the other terminal of the second capacitor, a control terminal of the fourth switch is input with the first switching signal; a positive input terminal of the second voltage comparator is electrically connected with the output terminal of the third switch, a negative input terminal of the second voltage comparator is connected with a reference voltage, an output terminal of the second voltage comparator is connected to a second input terminal of the second AND gate through the second inverter, a first input terminal of the second AND gate is input with the second switching signal, an output terminal of the second AND gate outputs the second control signal.

7. The level-shift circuit according to claim 6, wherein the third switch is turned on when the second switching signal is at a high level; the third switch is turned off when the second switching signal is at a low level; the fourth switch is turned on when the first switching signal is at a high level; the fourth switch is turned off when the first switching signal is at a low level.

8. A level-shift circuit, comprising:
a logic setting unit, a control unit, a first field effect transistor, a second field effect transistor and an over-current protection module;
an input terminal of the logic setting unit input with an initial signal, an output terminal of the logic setting unit connected with an input terminal of the control unit; the control unit comprising a first output terminal and a second output terminal;
a gate electrode of the first field effect transistor connected with the first output terminal and a source electrode of the first field effect transistor input with a high-level voltage; a gate electrode of the second field effect transistor connected with the second output terminal and a source electrode of the second field effect transistor input with a low-level voltage; drain electrodes of the first field effect transistor and the second field effect transistor connected with a total output terminal;
the over-current protection module, connected with the control unit, configured to reduce a resistance of the level-shift circuit when the level-shift circuit is in an initial stage, and increase the resistance of the level-shift circuit when the level-shift circuit is in a working stage, wherein the level-shift circuit is in the initial stage when the level-shift circuit is turned on and the level-shift circuit is in the working stage after the level-shift circuit has been turned on.

9. The level-shift circuit according to claim 8, wherein the control unit further comprises a third output terminal and a fourth output terminal;
the over-current protection module comprises a third field effect transistor, a fourth field effect transistor, a first retard unit, and a second retard unit;
an input terminal of the first retard unit is connected with the third output terminal, an input terminal of the second delay unit is connected with the fourth output terminal;
a gate electrode of the third field effect transistor is connected with an output terminal of the first retard unit and a source electrode of the third field effect transistor is input with the high-level voltage; a gate electrode of the fourth field effect transistor is connected with an output terminal of the second retard unit and a source electrode of the fourth field effect transistor is input with the low-level voltage; drain electrodes of the third field effect transistor and the fourth field effect transistor are connected with the total output terminal;
the first retard unit is configured to generate a first control signal based on a switching signal provided by the control unit; the second retard unit is configured to generate a second control signal based on the switching signal provided by the control unit.

10. The level-shift circuit according to claim 9, wherein the third field effect transistor is a P-channel field effect transistor and the fourth field effect transistor is an N-channel field effect transistor.

11. The level-shift circuit according to claim 10, wherein a resistance of the third field effect transistor is less than a resistance of the fourth field effect transistor, and the first control signal is at a high level and the second control signal is at a low level when the level-shift circuit is in the initial stage; the first control signal is at a low level and the second control signal is at the low level when the level-shift circuit is in the working stage.

12. The level-shift circuit according to claim 9, wherein the switching signal comprises a first switching signal and a second switching signal, the first retard unit comprises a first switch, a second switch, a first capacitor, a first voltage comparator, a first inverter, and a first AND gate; an input terminal of the first switch is connected with a DC power source, an output terminal of the first switch is electrically connected with one terminal of the first capacitor, a control terminal of the first switch is input with the first switching signal, another terminal of the first capacitor is grounded, an input terminal of the second switch is electrically connected with the terminal of the first capacitor, an output terminal of the second switch is electrically connected with the other terminal of the first capacitor, a control terminal of the second switch is input with the second switching signal; a positive input terminal of the first voltage comparator is electrically connected with the output terminal of the first switch, a negative input terminal of the first voltage comparator is connected with a reference voltage, an output terminal of the first voltage comparator is connected to a second input terminal of the first AND gate through the first inverter, a first input terminal of the first AND gate is input with the first switching signal, an output terminal of the first AND gate outputs the first control signal.

13. The level-shift circuit according to claim 12, wherein the first switch is turned on when the first switching signal is at a high level; the first switch is turned off when the first switching signal is at a low level; the second switch is turned on when the second switching signal is at a high level; the second switch is turned off when the second switching signal is at a low level.

14. The level-shift circuit according to claim 9, wherein the second retard unit comprises a third switch, a fourth switch, a second capacitor, a second voltage comparator, a second inverter, and a second AND gate; an input terminal of the third switch is connected with a DC power source, an output terminal of the third switch is electrically connected with one terminal of the second capacitor, a control terminal of the third switch is input with the second switching signal, the other terminal of the second capacitor is grounded, an input terminal of the fourth switch is electrically connected with the terminal of the second capacitor, an output terminal of the fourth switch is electrically connected with the other terminal of the second capacitor, a control terminal of the fourth switch is input with the first switching signal; a positive input terminal of the second voltage comparator is electrically connected with the output terminal of the third switch, a negative input terminal of the second voltage comparator is connected with a reference voltage, an output terminal of the second voltage comparator is connected to a second input terminal of the second AND gate through the second inverter, a first input terminal of the second AND gate is input with the second switching signal, an output terminal of the second AND gate outputs the second control signal.

15. The level-shift circuit according to claim 14, wherein the third switch is turned on when the second switching signal is at a high level; the third switch is turned off when the second switching signal is at a low level;
the fourth switch is turned on when the first switching signal is at a high level; the fourth switch is turned off when the first switching signal is at a low level.

16. The level-shift circuit according to claim 8, wherein the first field effect transistor is a P-channel field effect transistor; and the second field effect transistor is an N-channel field effect transistor.

17. A display device, comprising a level-shift circuit, comprising:
a logic setting unit, a control unit, a first field effect transistor, a second field effect transistor and an over-current protection module;
an input terminal of the logic setting unit input with an initial signal, an output terminal of the logic setting unit connected with an input terminal of the control unit; the control unit comprising a first output terminal and a second output terminal;
a gate electrode of the first field effect transistor connected with the first output terminal and a source electrode of the first field effect transistor input with a high-level voltage; a gate electrode of the second field effect transistor connected with the second output terminal and a source electrode of the second field effect transistor input with a low-level voltage; drain electrodes of the first field effect transistor and the second field effect transistor connected with a total output terminal;
the over-current protection module, connected with the control unit, configured to reduce a resistance of the level-shift circuit when the level-shift circuit is in an initial stage, and increase the resistance of the level-shift circuit when the level-shift circuit is in a working stage, wherein the level-shift circuit is in the initial stage when the level-shift circuit is turned on and the level-shift circuit is in the working stage after the level-shift circuit has been turned on.

18. The display device according to claim 17, wherein the control unit further comprises a third output terminal and a fourth output terminal;
the over-current protection module comprises a third field effect transistor, a fourth field effect transistor, a first retard unit and a second retard unit;
an input terminal of the first retard unit is connected with the third output terminal, an input terminal of the second retard unit is connected with the fourth output terminal;
a gate electrode of the third field effect transistor is connected with an output terminal of the first retard unit and a source electrode of the third field effect transistor is input with the high-level voltage; a gate electrode of the fourth field effect transistor is connected with an output terminal of the second retard unit and a source electrode of the fourth field effect transistor is input with the low-level voltage; drain electrodes of the third field effect transistor and the fourth field effect transistor are connected with the total output terminal;
the first retard unit is configured to generate a first control signal based on a switching signal provided by the control unit; the second retard unit is configured to generate a second control signal based on the switching signal provided by the control unit.

19. The display device according to claim 18, wherein the third field effect transistor is a P-channel field effect transistor and the fourth field effect transistor is an N-channel field effect transistor.

20. The display device according to claim 19, wherein a resistance of the third field effect transistor is less than a resistance of the fourth field effect transistor, and the first control signal is at a high level and the second control signal is at a low level when the level-shift circuit is in the initial stage of the level-shift circuit, the first control signal is at a high level and the second control signal is at a low level;
the first control signal is at a low level and the second control signal is at the low level when the level-shift circuit is in the working stage.

* * * * *